United States Patent
Bishop et al.

(10) Patent No.: US 12,107,410 B2
(45) Date of Patent: Oct. 1, 2024

(54) TRANSFORMER OVERCURRENT PROTECTION

(71) Applicant: S&C Electric Company, Chicago, IL (US)

(72) Inventors: Martin T. Bishop, Oak Creek, WI (US); Stephen E. Williams, Caledonia, WI (US); Marcelo Perez, New Berlin, WI (US)

(73) Assignee: S&C Electric Company, Chicago, IL (US)

( * ) Notice: Subject to any disclaimer, the term of this patent is extended or adjusted under 35 U.S.C. 154(b) by 173 days.

(21) Appl. No.: 17/677,879

(22) Filed: Feb. 22, 2022

(65) Prior Publication Data

US 2022/0271527 A1 Aug. 25, 2022

Related U.S. Application Data

(60) Provisional application No. 63/153,658, filed on Feb. 25, 2021.

(51) Int. Cl.
*H02H 7/045* (2006.01)
*G01R 31/62* (2020.01)
*H01F 27/40* (2006.01)

(52) U.S. Cl.
CPC ............. *H02H 7/045* (2013.01); *G01R 31/62* (2020.01); *H01F 27/402* (2013.01); *H01F 2027/406* (2013.01)

(58) Field of Classification Search
CPC ...... H02H 7/045; G01R 31/62; H01F 27/402; H01F 2027/406

(Continued)

(56) References Cited

U.S. PATENT DOCUMENTS 5,274,349 A * 12/1993 Hassler ................... H01H 9/32
337/171
2009/0091867 A1* 4/2009 Guzman-Casillas .. H02H 7/045
361/35

(Continued)

OTHER PUBLICATIONS

Bishop et al.; Considerations in the Use of Current Limiting Fuses on Pole-Type Transformers; 1991 IEEE; Reprinted from Proceedings of the 1991 IEEE Power Engineering Society, Transmission and Distribution Conference; Dallas. Texas Sep. 22-27, 1991; pp. 516-522 (7 pages).

(Continued)

*Primary Examiner* — Yemane Mehari

(57) ABSTRACT

A system and method for determining when an electronic interrupting device will open in response to detecting overcurrent, where the interrupting device protects a transformer in a power distribution network. The method includes obtaining a time/current through fault protection curve that is defined by a plurality of time/current points for the transformer that identifies when the transformer may experience thermal or mechanical damage in response to a certain current flow over a certain time in the transformer windings, selecting a time multiplier, and determining an operating curve for the interrupting device by multiplying the multiplier and a time portion of each of the plurality of time/current points on the through fault protection curve, where the operating curve identifies when the interrupting device will open in response to a certain current flow over a certain time.

18 Claims, 2 Drawing Sheets

(58) Field of Classification Search
USPC .......................................................... 361/35
See application file for complete search history.

(56) References Cited

U.S. PATENT DOCUMENTS

| 2011/0031220 A1* | 2/2011 | Nilsson ................ H01H 9/0038 |
| | | 218/118 |
| 2011/0125339 A1* | 5/2011 | Bright ...................... H02H 7/28 |
| | | 700/293 |
| 2020/0244059 A1* | 7/2020 | Lellis Junior ........ H01H 50/641 |

OTHER PUBLICATIONS

International Search Report and Written Opinion for International Application No. PCT/US2022/017362 dated Jun. 15, 2022. (10 pages).

* cited by examiner

TRANSFORMER OVERCURRENT PROTECTION

CROSS-REFERENCE TO RELATED APPLICATION

This application claims the benefit of priority from the U.S. Provisional Application No. 63/153,658, filed on Feb. 25, 2021, the disclosure of which is hereby expressly incorporated herein by reference for all purposes.

BACKGROUND

Field

This disclosure relates generally to a method for programming the operation of an electronic interrupting device to closely follow a through fault protection curve for a transformer and, more particularly, to a method for selecting an operating curve for an electronic interrupting device that closely follows a through fault protection curve for a distribution transformer by multiplying a defined time of the through fault protection curve by a multiplier in a selected current operating range.

Discussion of the Related Art

An electrical power distribution network, often referred to as an electrical grid, typically includes power generation plants each having power generators, such as gas turbines, nuclear reactors, coal-fired generators, hydro-electric dams, etc. The power plants provide power at medium voltages that are then stepped up by transformers to a high voltage AC signal to be connected to high voltage transmission lines that deliver electrical power to substations typically located within a community, where the voltage is stepped down to a medium voltage for distribution. The substations provide the medium voltage power to three-phase feeders that carry the same current for balanced loading, but are 120° apart in phase. three-phase and single phase lateral lines are tapped off of the feeders that provide the medium voltage to distribution lines that each include a distribution transformer, where the voltage is stepped down to a low voltage and is provided to loads, such as homes, businesses, etc.

Periodically, faults occur in the distribution network as from things, such as animals touching the lines, lightning strikes, tree branches falling on the lines, vehicle collisions with utility poles, etc. Faults may create a short-circuit, which may cause the current flow from the substation to significantly increase, for example, many times above the normal current, along the fault path. This amount of current causes the electrical lines to significantly heat up and possibly melt, and also could cause mechanical damage to various components in the substation and in the network.

Traditionally, a fuse is employed as a primary overload protection device for protecting distribution transformers that has a certain rating so that the fuse will operate above a transformer inrush current, but below a transformer through fault protection withstand or damage curve. Primary overload protection is also expected to protect the transformer from damage due to long overloads and secondary faults by removing the transformer from service after a severe overload of significant time duration. Secondary faults producing winding currents that are many times full load magnitude should also result in operation of the protection device before thermal or mechanical damage occurs to the transformer. The time limits for winding current as a multiple of full load current are established by IEEE C57.109, Guide for Liquid-Immersed Transformer Through-Fault-Current Duration. As a general guideline, the fuse time current characteristic (TCC) curve should be below and to the left of the transformer through-fault-duration withstand curve so as to minimize the loss of transformer life due to the mechanical and thermal effects of sustained faults and longtime overload conditions.

A primary side protective device used for a pole-type transformer is subject to energizing inrush transient currents and cold-load currents, which should be accounted for, so that the protection is not activated during these events. Typical inrush current magnitudes for distribution transformers are twelve times full load at the 0.1 second point and 25 times full load at the 0.01 second point. Cold-load inrush currents that are above rated full load current for many seconds must be carried by the fuse or other protective device after an outage. Typical cold-load inrush points are two times full load at 100-300 seconds, three times full load at 10 seconds, and six times full load at one second. Some utilities may experience twice full load current for 30 minutes and three times full load for 30 seconds when resistive load predominates. The inrush points and cold-load pickup points form a TCC curve that must fall below and to the left of the protective device's minimum TCC curve.

In all applications, the primary protective device for a pole-type distribution transformer should maintain proper coordination with upstream devices. It must be the first device to trip, thus avoiding the operation of upstream devices that result in a large number of affected customers. Primary protection of pole-type distribution transformers must be the fastest in the system, but only tripping when it is necessary.

Fault interrupting devices, for example, single phase self-powered magnetically actuated reclosers that employ vacuum interrupters, are provided on utility poles and in underground circuits along a power line and have a switch to allow or prevent power flow downstream of the recloser. Reclosers and fault interrupters of this type typically detect the current and/or voltage on the line to monitor current flow and have controls that indicate problems with the network circuit, such as detecting a high current fault event. For example, a recloser may employ a Rogowski coil, well known to those skilled in the art, that is wrapped around the power line and measures current flow on the line by the voltage that is induced in the coil being proportional to the rate of change of current flow. If such a high fault current is detected the recloser is opened in response thereto, and then after a short delay closed to determine whether the fault is a transient fault. If high fault current flows when the recloser is closed after opening, it is immediately re-opened. If the fault current is detected a second time, or multiple times, during subsequent opening and closing operations indicating a persistent fault, then the recloser remains open, where the time between detection tests may increase after each test. For a typical reclosing operation for fault detection tests, about 3-6 cycles or 50 to 100 ms of fault current pass through the recloser before it is opened, but testing the circuit by reclosing after shifting to on delayed curves can allow fault current to flow for much longer times, which could cause significant stress on various components in the network.

It has become increasingly more popular to replace the traditional fuse with a fault interrupting or reclosing device at the location where a distribution lateral line is tapped off of a main three phase feeder or where a distribution transformer is connected to either a main or a lateral line. These devices reduce the number of service calls to replace fuses in response to temporary faults that can be cleared by the fault interrupting device. One of those devices used for this purpose is known as the VacuFuse™ transformer protector, available from S&C Electric Company, Chicago, Illinois, USA.

SUMMARY

The following discussion discloses and describes a system and method for determining when an electronic interrupting device, such as a device with a vacuum interrupter and operating mechanism, will open in response to detecting overcurrent, where the electronic interrupting device protects a transformer, such as a distribution transformer, in a power distribution network. The method includes obtaining a time/current through fault protection curve that is defined by a plurality of time/current points for the transformer that identifies when the transformer may experience thermal or mechanical damage in response to a certain current flow over a certain time in the transformer windings, selecting a time multiplier, and determining an operating curve for the electronic interrupting device by multiplying the multiplier and a time portion of each of the plurality of time/current points on the through fault protection curve, where the operating curve identifies when the vacuum interrupter will open in response to a certain current flow over a certain time.

Additional features of the disclosure will become apparent from the following description and appended claims, taken in conjunction with the accompanying drawings.

DETAILED DESCRIPTION OF THE EMBODIMENTS

The following discussion of the embodiments of the disclosure directed to a method for programming the operation of an electronic interrupting device to closely follow a through fault protection curve for a transformer is merely exemplary in nature, and is in no way intended to limit the disclosure or its applications or uses.

Figure 1:
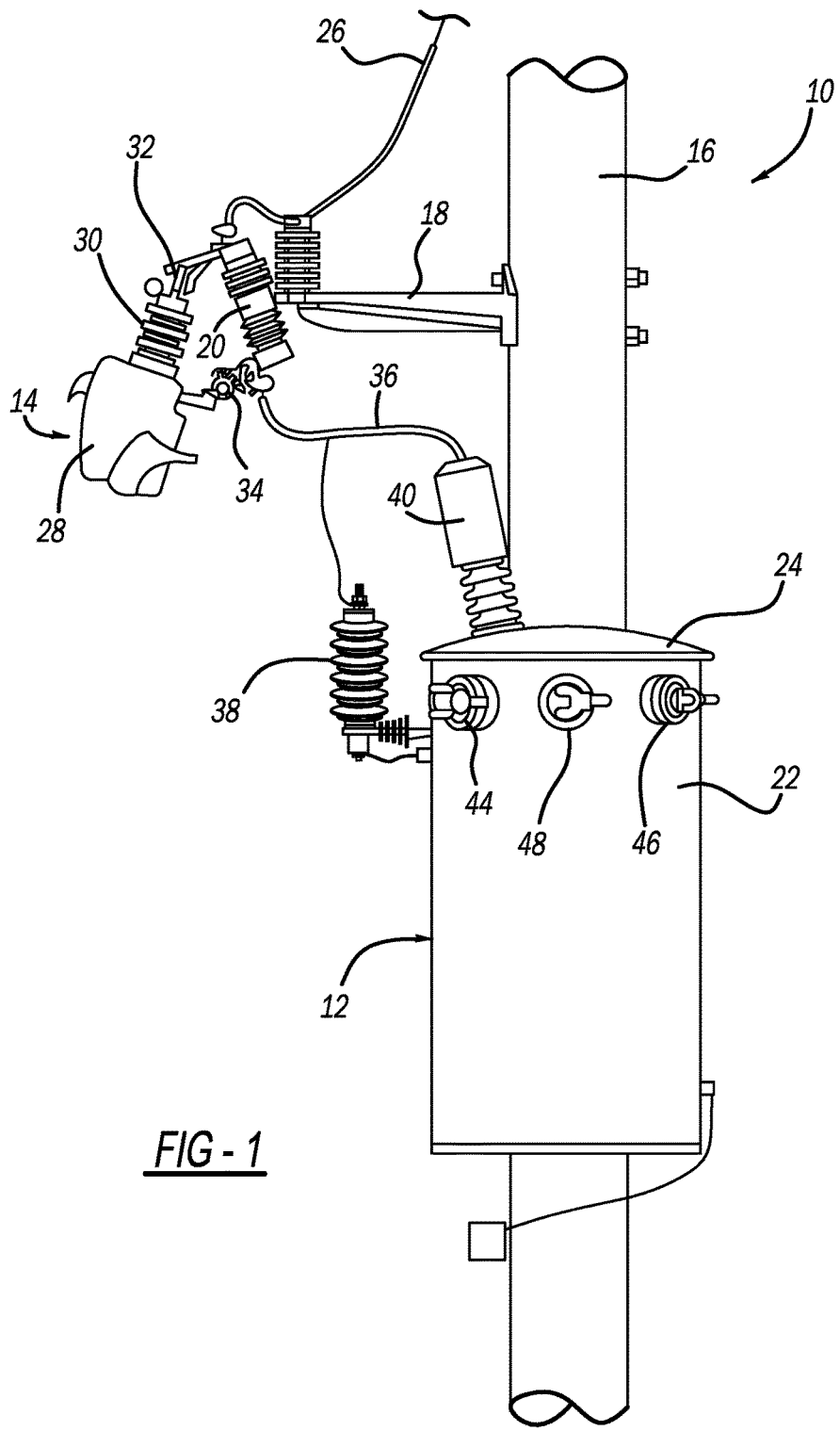
FIG. 1 is an illustration of a pole mounted transformer system including a distribution transformer and an electronic current interrupting device.

FIG. 1 is an illustration of a pole mounted transformer system 10 including a distribution transformer 12 mounted to a utility pole 16 and a cut-out mounted interrupting device 14 with reclosing capability mounted to the utility pole 16 by a mount 18 and an insulator 20, where the interrupting device 14 replaces the traditional fuse. The transformer 12 includes an outer tank 22 that is generally cylindrically shaped and has a cover or lid 24 typically filled with insulating fluid, such as mineral oil, that houses the primary and secondary coils and the transformer core assembly. The transformer 12 will have a certain size and power rating based on the amount of load it services, a primary voltage at the terminals of the primary coil during normal operation, a normal full load or base current calculated using nameplate kVA and voltage and a current overload percentage that allows the transformer 12 to operate a certain percentage above its normal load for a certain amount of time. In one non-limiting example merely for representative purposes for the discussion herein, the transformer 12 has a power rating of 25 kVA (kilovolt-ampere), a primary voltage of 7.2 kV, a base current of 3.5 A and an overload percentage of 250%. The interrupting device 14 is intended to represent any reclosing or fault interrupting device of the type discussed above, such as a single phase self-powered magnetically actuated recloser that employs a vacuum interrupter, suitable for performing reclosing operations at a location where a power line 26 is tapped off of a lateral line (not shown). The interrupting device 14 includes a vacuum interrupter 30 and an enclosure 28 housing all of the actuators, electronics, components, sensors for measuring and harvesting current, controllers, processors, communications devices, etc. for operating the interrupting device 14 as discussed herein. If the interrupting device 14 performs a reclosing operation and the fault current is still present and repeated current interruption is required, it will be released from a connector 32 and pivot on a hinge 34 to provide a visual indication that is has operated.

The power line 26 at medium voltage that is tapped off of the distribution line is electrically coupled to one terminal of the interrupting device 14 and a power line 36 at medium voltage is electrically coupled to the other terminal of the interrupting device 14 and the primary winding in the transformer 12 through a bushing 40, where the bushing 40 includes an internal conductor and an outer insulation body. A surge arrester 38 is coupled to the line 36 and the tank 22 to provide over-voltage protection from, for example, lightning strikes that may have a duration much less than the response time of the interrupting device 14, but would otherwise cause a traditional fuse to operate. The transformer 12 steps down the medium voltage on the line 36 to a lower voltage, and, in this example, provides 120 volt power at a terminal 44 or 46 and a ground terminal 48 and 240 volt power between the terminals 44 and 46, where the ground terminal 48 is electrically coupled to a neutral line (not shown) in most applications.

TCC relationships between time and current for various transformer parameters are provided as industry standards, where operating time is provided relative to current loading. For example, one industry standard provides a relationship between time and current that identifies the top limit of how much current and for how long the transformer can support before its working life is reduced, sometimes referred to as a transformer through-fault-protection (or duration) withstand. These relationships often are shown as a graph with a current scale on the horizontal axis and time on the vertical axis. Those standards can be converted to actual TCC curves for particular transformers, where the current scale is converted to actual amps by multiplying the scale by the transformer's normal base current. For a single phase transformer, the base current is the transformer's power rating divided by the transformer primary voltage. For the example discussed herein for the transformer 12, 25 kVA divided by 7.2 kV is 3.47 amps base current.

Figure 2:
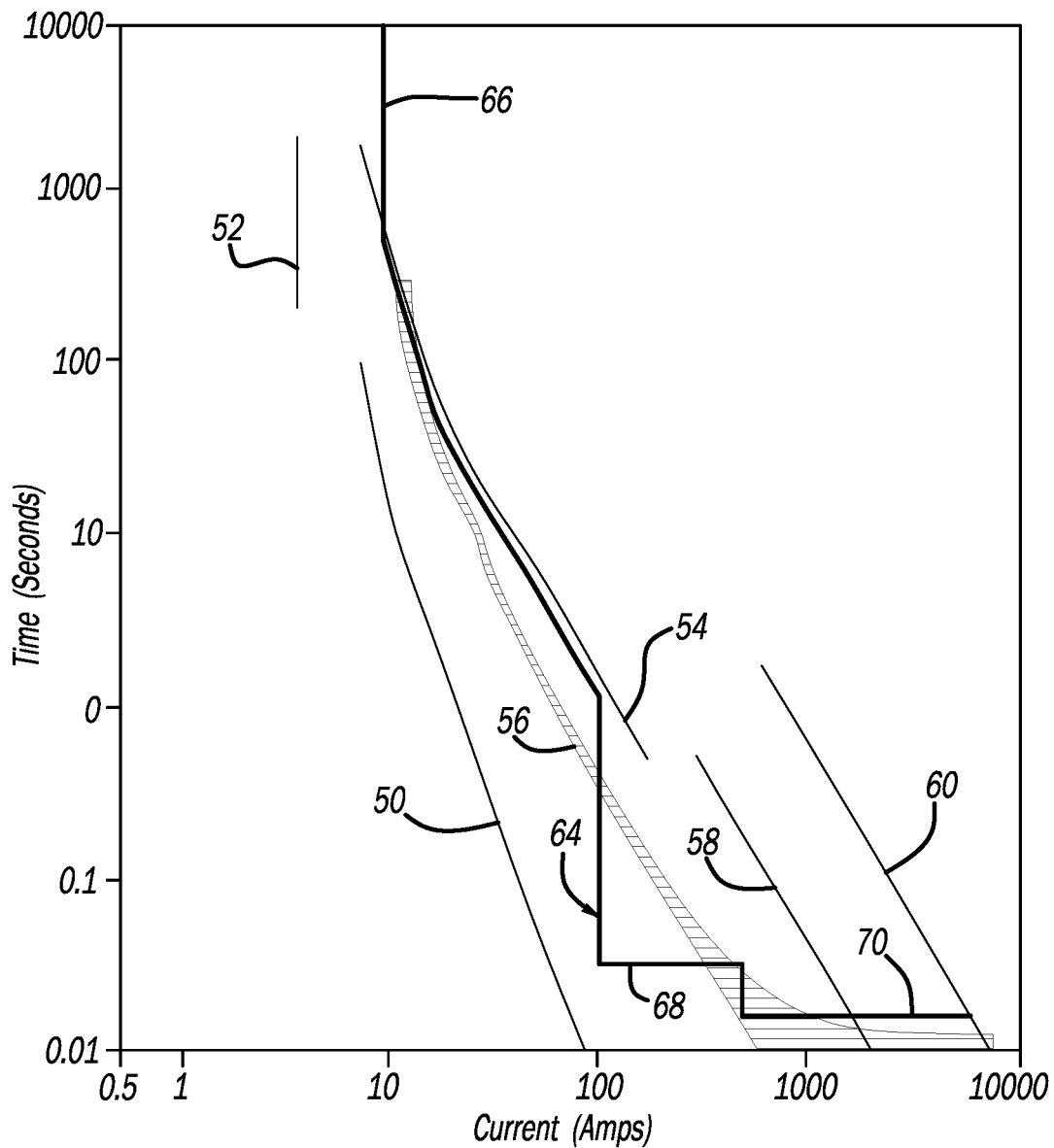
FIG. 2 is a logarithmic graph with current on the horizontal axis and time on the vertical axis showing a through fault protection curve for the transformer and an operating curve for the interrupting device in the system shown in FIG. 1.

FIG. 2 is a logarithmic graph with current in amps on the horizontal axis and time in seconds on the vertical axis showing various TCC curves as discussed below for the example discussed herein, where the industry standard current scale has been multiplied by 3.47 on the horizontal axis. TCC curve 50 is a transformer inrush curve that represents normal inrush current for the transformer 12 when it is energized and the transformer magnetics have not yet stabilized and curve 52 represents the normal transformer current once the transformer magnetics have been stabilized and the transformer 12 is operating normally at nameplate voltage and kVA. TCC curve 54 is a transformer through fault protection withstand or damage curve for the transformer 12 of the type referred to above that shows the point above which for a certain current and for a certain amount of time the operating parameters of the transformer 12 are exceeded, which could damage the insulation on the windings, reduce the transformer's life because of excessive wear, cause the transformer to fail, etc. depending on how much current and for how long. The current and time values that are used to obtain the through fault protection curve 54 would have been developed over decades of industry experience and are published in standards. The through fault protection curved 54 is above the curves 50 and 52 for the normal operation of the transformer 12. Curve 58 is an enclosure withstand curve for the transformer tank 22 for asymmetrical fault currents with a let-through $I^2T$ of 150,000 and a system X/R of 15, and curve 60 is an enclosure withstand curve for the transformer tank 22 for symmetrical fault currents with a let-through $I^2T$ of 150,000 and a system X/R of 15.

Traditionally, the design engineer will select a fuse for protecting the transformer 12 that has a certain rating so that the fuse will operate above the inrush current, but below the curve 54, where the current/time relationship for when the fuse operates is shown as section 56 in this example. Much engineering goes into determining what fuse would be best for what transformer and for what application so that it operates at the desired time usually, but not always, just below the curve 54. However, the shape of the section 56 is primarily determined by the physical properties and materials of the fuse, which limit how well the section 56 can be shaped to the through fault protection curve 54. As is apparent, for lower currents and longer times, the section 56 meets with and passes the through fault protection curve 54 to allow transformer overloading for short times, and thus the proper fuse usually is selected to protect the transformer 12 at these currents and times. However, for shorter times and higher currents, the section 56 is significantly spaced from the damage curve 54, which could result in the fuse operating before it is necessary or desirable, thus risking the operation for non-fault related events.

In response to using an electronic fuse, such as the interrupting device 14, to replace the traditional fuse, this disclosure proposes programming or controlling the interrupting device 14 so that it operates as close to the through fault protection curve 54 as possible, thus preventing the interrupting device 14 from operating unless the through fault protection curve 54 will be exceeded. That programming and control would be provided in the controllers and processors provided in the enclosure 28 in a manner well understood by those skilled in the art. Currently, known electronic fuses that are being used in the field are programmed to follow the fuse characteristic of the section 56. This control of the interrupting device 14 is shown by TCC operating curve 64 that follows just below the damage curve 54. A top straight section 66 of the curve 64 accounts for the current overload percentage of the transformer 12 where as long as the current is below the section 66 the interrupting device 14 won't operate for any amount of time. Below the section 66, most of the curve 64 follows just below the curve 54, and at some value, 100 amps in this example, the interrupting device 14 trips at two fundamental power frequency cycles shown by section 68, and at 500 amps the interrupting device 14 trips at one fundamental power frequency cycle shown as section 70. As is apparent, the space between the curve 54 and the section 56 is removed by using the curve 64 instead of the section 56.

The shape and location of the operating curve 64 between the sections 66 and 68 is determined based on a predetermined time multiplier that is usually less than one. Each time associated with each time/current sample point along the curve 54 is extracted and then multiplied by the multiplier. That new time for each sample point is then plotted on the graph with the current for that point and the new sample points are connected to form the curve 64. The multiplier can be selected based on experimentation for a certain transformer and application. For the example being discussed herein that formed the curve 64, the multiplier is 0.75. Some designs may want the operating curve 64 to be above the curve 54.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A method for determining when an electronic interrupting device will open in response to detecting overcurrent, the electronic interrupting device protecting a transformer having a winding in a power distribution network, the method comprising:
    obtaining a time/current through fault protection curve that is defined by a plurality of time/current points for the transformer that identifies when the transformer may experience thermal or mechanical damage in response to a certain current flow over a certain time in the transformer winding;
    selecting a time multiplier; and
    determining an operating curve for the electronic interrupting device, wherein the operating curve identifies when the electronic interrupting device will open in response to a certain current flow over a certain time, by multiplying the multiplier and a time portion of each of the plurality of time/current points on the through fault protection curve for a first portion of the operating curve, and providing a one fundamental power frequency cycle portion of the operating curve that defines a current that if exceeded will cause the electronic interrupting device to operate after one fundamental power frequency cycle.

2. The method according to claim 1 wherein the multiplier is less than one.

3. The method according to claim 1 wherein determining an operating curve includes providing an overload portion of the operating curve that defines an overload current that if not exceeded for any amount of time the electronic interrupting device will not open.

4. The method according to claim 1 wherein determining an operating curve includes providing a two fundamental power frequency cycle portion of the operating curve that defines a current that if exceeded will cause the electronic interrupting device to open after two fundamental power frequency cycles.

5. The method according to claim 1 wherein the transformer is a distribution transformer that converts medium voltage to low voltage to be delivered to low voltage customer loads.

6. The method according to claim 1 wherein the interrupting device is a cut-out mounted interrupting device.

7. The method according to claim 1 wherein the interrupting device is a single phase self-powered magnetically actuated recloser.

8. The method according to claim 1 wherein the interrupting device includes a vacuum interrupter.

9. The method according to claim 1 wherein the interrupting device and the transformer are mounted to the same utility pole.

10. A method for determining when a current interrupting device will open in response to detecting overcurrent, the interrupting device protecting a distribution transformer having a winding in a power distribution network, the method comprising:
obtaining a time/current through fault protection curve that is defined by a plurality of time/current points for the transformer that identifies when the transformer may experience thermal or mechanical damage in response to a certain current flow over a certain time in the transformer windings;
selecting a time multiplier; and
determining an operating curve for the interrupting device by multiplying the multiplier and a time portion of each of the plurality of time/current points on the through fault protection curve, wherein the operating curve identifies when the interrupting device will open in response to a certain current flow over a certain time, wherein determining the operating curve also includes providing an overload portion of the operating curve that defines an overload current that if not exceeded for any amount of time the interrupting device will not open, providing a two fundamental power frequency cycle portion of the operating curve that defines a current that if exceeded will cause the interrupting device to open after two fundamental power frequency cycles and providing a one fundamental power frequency cycle portion of the operating curve that defines a current that if exceeded will cause the interrupting device to open after one fundamental power frequency cycle.

11. The method according to claim 10 wherein the multiplier is less than one.

12. A method for determining when an electronic interrupting device will open in response to detecting overcurrent, the electronic interrupting device protecting a transformer having a winding in a power distribution network, the method comprising:
obtaining a time/current through fault protection curve that is defined by a plurality of time/current points for the transformer that identifies when the transformer may experience thermal or mechanical damage in response to a certain current flow over a certain time in the transformer winding;
selecting a time multiplier;
determining an operating curve for the electronic interrupting device, wherein the operating curve identifies when the electronic interrupting device will open in response to a certain current flow over a certain time, by multiplying the multiplier and a time portion of each of the plurality of time/current points on the through fault protection curve for a first portion of the operating curve, and providing a two fundamental power frequency cycle portion of the operating curve that defines a current that if exceeded will cause the electronic interrupting device to operate after two fundamental power frequency cycles.

13. An electronic interrupting device associated with a transformer in power distribution network that is configured to interrupt current flow through the transformer in response to overcurrent to protect the transformer, the transformer having a time/current through fault protection curve that is defined by a plurality of time/current points for the transformer that identifies when the transformer may experience thermal or mechanical damage in response to a certain current flow over a certain time in the transformer winding the electronic interrupting device comprising:
an operating curve for the electronic interrupting device in response to which the electronic interrupting device operates to interrupt current flow through the transformer, the operating curve having a multiplier portion defined by multiplying the multiplier and a time portion of each of the plurality of time/current points on the through fault protection curve, a two fundamental power frequency cycle portion defined by a current that if exceeded will cause the electronic interrupting device to interrupt current flow through the transformer after two fundamental power frequency cycles, and a one fundamental power frequency cycle portion defined by a current that if exceeded will cause the electronic interrupting device to open after one fundamental power frequency cycle.

14. The electronic interrupting device according to claim 13 wherein the multiplier is less than one.

15. The electronic interrupting device according to claim 13 wherein the operating curve comprises an overload portion defined by an overload current that if not exceeded for any amount of time the electronic interrupting device will not open.

16. The electronic interrupting device according to claim 13 wherein the transformer is a distribution transformer that converts medium voltage to low voltage to be delivered to low voltage customer loads.

17. The electronic interrupting device according to claim 13 wherein the interrupting device is a cut-out mounted interrupting device.

18. The electronic interrupting device according to claim 13 wherein the interrupting device is a single phase self-powered magnetically actuated recloser.

* * * * *